United States Patent
Yamaguchi et al.

(10) Patent No.: US 7,649,715 B2
(45) Date of Patent: Jan. 19, 2010

(54) MAGNETIC HEAD ASSEMBLY BONDING ELECTRODE PAD OF SLIDER AND ELECTRODE PAD OF FLEXIBLE WIRING SUBSTRATE TOGETHER BY SOLDER

(75) Inventors: Ooki Yamaguchi, Niigata-ken (JP); Takao Haino, Niigata-ken (JP); Hideaki Abe, Niigata-ken (JP)

(73) Assignee: TDK Corporation, Tokyo (JP)

( * ) Notice: Subject to any disclaimer, the term of this patent is extended or adjusted under 35 U.S.C. 154(b) by 288 days.

(21) Appl. No.: 11/553,892

(22) Filed: Oct. 27, 2006

(65) Prior Publication Data

US 2007/0097550 A1 May 3, 2007

(30) Foreign Application Priority Data

Nov. 1, 2005 (JP) ............................. 2005-318709

(51) Int. Cl.
*G11B 5/58* (2006.01)
(52) U.S. Cl. .................................. 360/245.3; 360/234.5
(58) Field of Classification Search .............. 360/234.5, 360/234.6, 245.3, 245.9
See application file for complete search history.

(56) References Cited

U.S. PATENT DOCUMENTS

| | | | | |
|---|---|---|---|---|
| 5,982,584 A * | 11/1999 | Bennin et al. | ............ | 360/245.9 |
| 6,125,015 A * | 9/2000 | Carlson et al. | ............ | 360/245.9 |
| 6,266,214 B1 * | 7/2001 | Khan | ............ | 360/245.9 |
| 6,728,068 B1 * | 4/2004 | Himes et al. | ............ | 360/234.5 |
| 7,137,187 B2 * | 11/2006 | Pan et al. | ............ | 29/603.03 |
| 2002/0060882 A1 | 5/2002 | Kidachi et al. | | |
| 2004/0228036 A1 | 11/2004 | Yamaguchi | | |
| 2005/0044698 A1 * | 3/2005 | Childers et al. | ............ | 29/603.06 |
| 2005/0195529 A1 * | 9/2005 | Tsuchida et al. | ............ | 360/234.5 |

FOREIGN PATENT DOCUMENTS

| | | |
|---|---|---|
| JP | 7006535 | 1/1995 |
| JP | 2000-348455 | 12/2000 |
| JP | 2002-170351 | 6/2002 |
| JP | 2004-283911 | 10/2004 |
| JP | 2006-269017 | 10/2006 |

OTHER PUBLICATIONS

Office Action issued in corresponding Japanese Office Action; issued May 13, 2008.
Notice of Allowance issued in corresponding Japanese Patent Application No. 2005-318709; issued Sep. 16, 2008.

* cited by examiner

*Primary Examiner*—Jefferson Evans
(74) *Attorney, Agent, or Firm*—Brinks Hofer Gilson & Lione (57) ABSTRACT

A magnetic head assembly is provided. The magnetic head assembly includes a slider in which a head element is mounted. A flexure supports the slider. The flexure includes a pair of outriggers, a connection portion, and a tongue portion. A flexible wiring substrate is fixedly bonded to the surface of the flexure. An electrode pad of the slider and an electrode pad of the flexible wiring substrate are bonded to each other by solder. A plurality of solder bonded portions are arranged on the connection portion. A deformable portion is formed in the pair of outriggers and located on an extended line on which the solder bonded portions are arranged, so that the free end side of the flexure is deformable.

4 Claims, 8 Drawing Sheets

MAGNETIC HEAD ASSEMBLY BONDING ELECTRODE PAD OF SLIDER AND ELECTRODE PAD OF FLEXIBLE WIRING SUBSTRATE TOGETHER BY SOLDER

This patent document claims the benefit of Japanese Patent Application No. 2005-318709 filed on Nov. 1, 2005, which is hereby incorporated by reference.

BACKGROUND

1. Field

The present embodiments relate to a magnetic head assembly bonding electrode pad of slider and electrode pad of flexible wiring substrate together by solder.

2. Related Art

In the related art, a magnetic head assembly used in a hard disk drive (HDD) includes a slider that has a head element mounted therein. A flexure, which is formed of a resilient thin metal plate, elastically supports the slider. A flexible wiring substrate, which is bonded to the surface of the flexure, electrically connects the head element and an external circuit system. The flexure is fixed by spot welding to a load beam. In this kind of magnetic head assembly, an electrode pad of the head element of the slider is bonded by gold ball bonding to an electrode pad of the flexible wiring substrate in an orthogonal relationship. Recently, in order to respond to the trend in that a bonded region (the size of the electrode pad and the interval between the electrode pads) is narrowed, a solder ball bonding method using a solder ball which has a smaller diameter than that of the gold ball has been described in JP-A-2004-283911 (US 2004228036A1).

The solder ball bonding method can be performed by using a mounter of an SJB (Solder Jet Bonding) type in which a melted ball is spurted toward a bonded surface. By solidifying the melted ball, which is applied onto the bonded surface by the mounter, the electrode pad of the slider and the electrode pad of the flexible wiring substrate are bonded to each other. A surface protective layer composed of an Au film is formed on the surface (bonded surface) of the electrode pads of the slider and the flexible wiring substrate so as to increase solder wettability.

However, once the solder ball is applied in a wet state to the bonded surface, the solder ball is rapidly cooled and solidified before it sufficiently diffuses. For this reason, because of shrinkage deformation caused by solidification of the solder ball, the position (roll angle, pitch angle) of the slider is significantly changed before and after soldering. The positional change may deteriorate floating characteristics of the magnetic head slider, for example, output characteristics.

SUMMARY

The present embodiments may obviate one or more limitations of the related art. For example, in one embodiment a magnetic head assembly is capable of preventing positional changes of a slider.

Generally, deformation of the free end side of the flexure does not cause positional changes of the slider, while deformation of the base side of a flexure causes positional changes of the slider, and the free end side of the flexure absorbs shrinkage deformation caused by solidification of solder so as to prevent positional changes of the slider before and after soldering.

In one embodiment, the magnetic head assembly includes a slider in which a head element is mounted. A flexure supports the slider. A flexible wiring substrate is fixedly bonded to the surface of the flexure. In one embodiment of the magnetic head assembly, an electrode pad of the slider and an electrode pad of the flexible wiring substrate are bonded to each other by solder.

The flexure includes a tongue portion which is fixedly bonded to the slider. A connection portion is connected to the tongue portion at a free end of the flexure. A pair of outriggers extend toward a base of the flexure from both sides of the connection portion to support the tongue portion to be elastically deformable. A plurality of solder bonded portions of the electrode pad is arranged on the connection portion. An easily deformable portion is formed in the pair of outriggers so as to be located on an extended line on which the solder bonded portions are arranged, so that the free end side of the flexure is easily deformable.

In one embodiment, the easily deformable portion may be composed of a bent portion that is formed by bending the free end side of the flexure toward the base side. The easily deformable portion may be composed of a notch which partially narrows the outrigger. The easily deformable portion may be composed of one or more openings which decrease the area of the outriggers at a position parallel to the arrangement direction of the solder bonded portions. The easily deformable portion may be composed of a groove which is formed on a front or rear surface of the outrigger. When the easily deformable portion is composed of one or more openings, it is preferable that the openings are formed in parallel to the arrangement direction of the solder bonded portions in order to make the easily deformable portion more deformable.

In one embodiment, since the free end side of the outriggers absorbs stress caused by solidification of solder through the easily deformable portion, the base side of the flexure is prevented from being deformed, so that a magnetic head assembly capable of preventing positional changes of a slider is provided.

DETAILED DESCRIPTION

Figure 1:
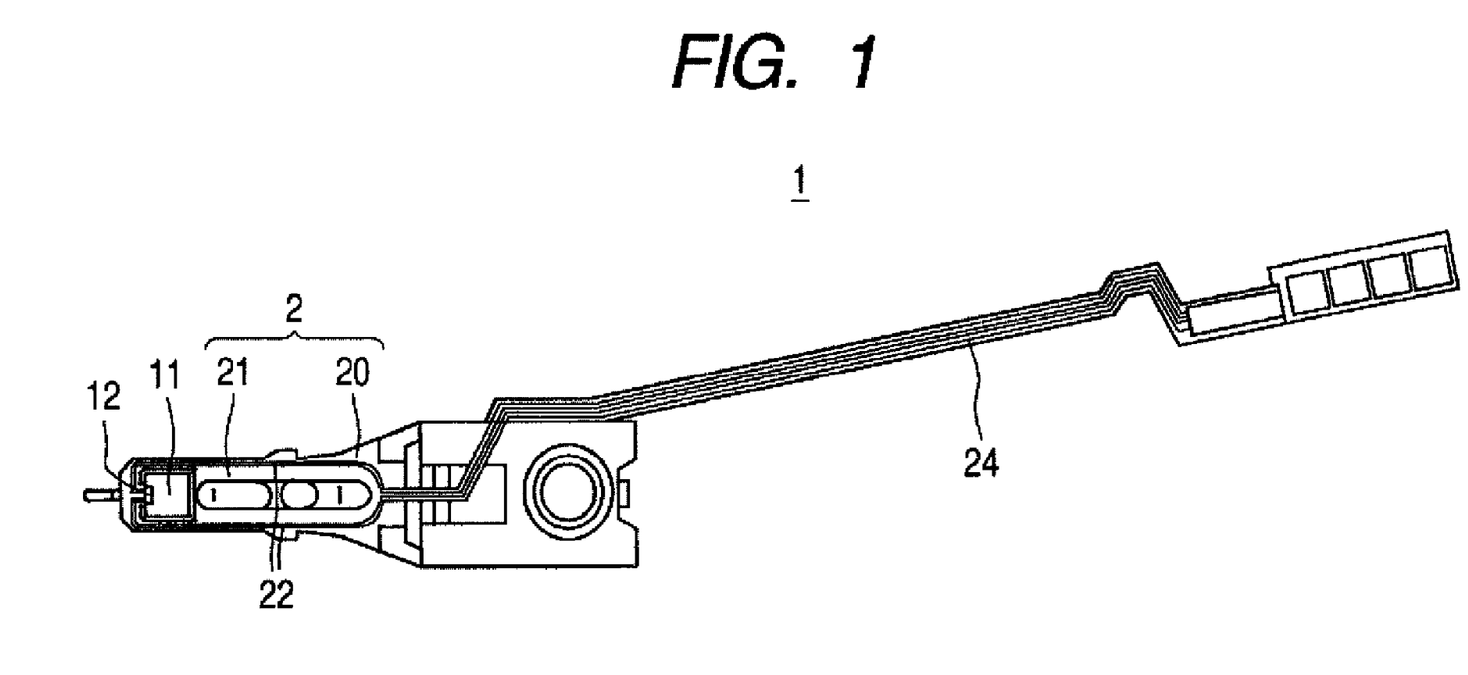
FIG. 1 is a plan view that shows the entire construction of a magnetic head assembly (completed) according to one embodiment.

FIG. 1 is a plan view that shows the entire construction of a magnetic head assembly (completed). A magnetic head assembly 1 is composed of a slider 11 and a support member 2 which supports the slider 11. The slider 11 is formed of a ceramic material, and a head element 12 is formed at a trailing end of the slider 11. The head element 12 includes an MR element (read head) which detects a leakage magnetic field from a disk D by using a magnetoresistance effect and reads out magnetic signals, and an inductive element (write head) in which, for example, a coil pattern is formed.

The support member 2 of the slider 11 has a rocking fulcrum other than the disk D which is rotatably driven. A load beam 20 extends from the top of the disk D. A flexure 21 is combined with the load beam 20.

Figure 2:
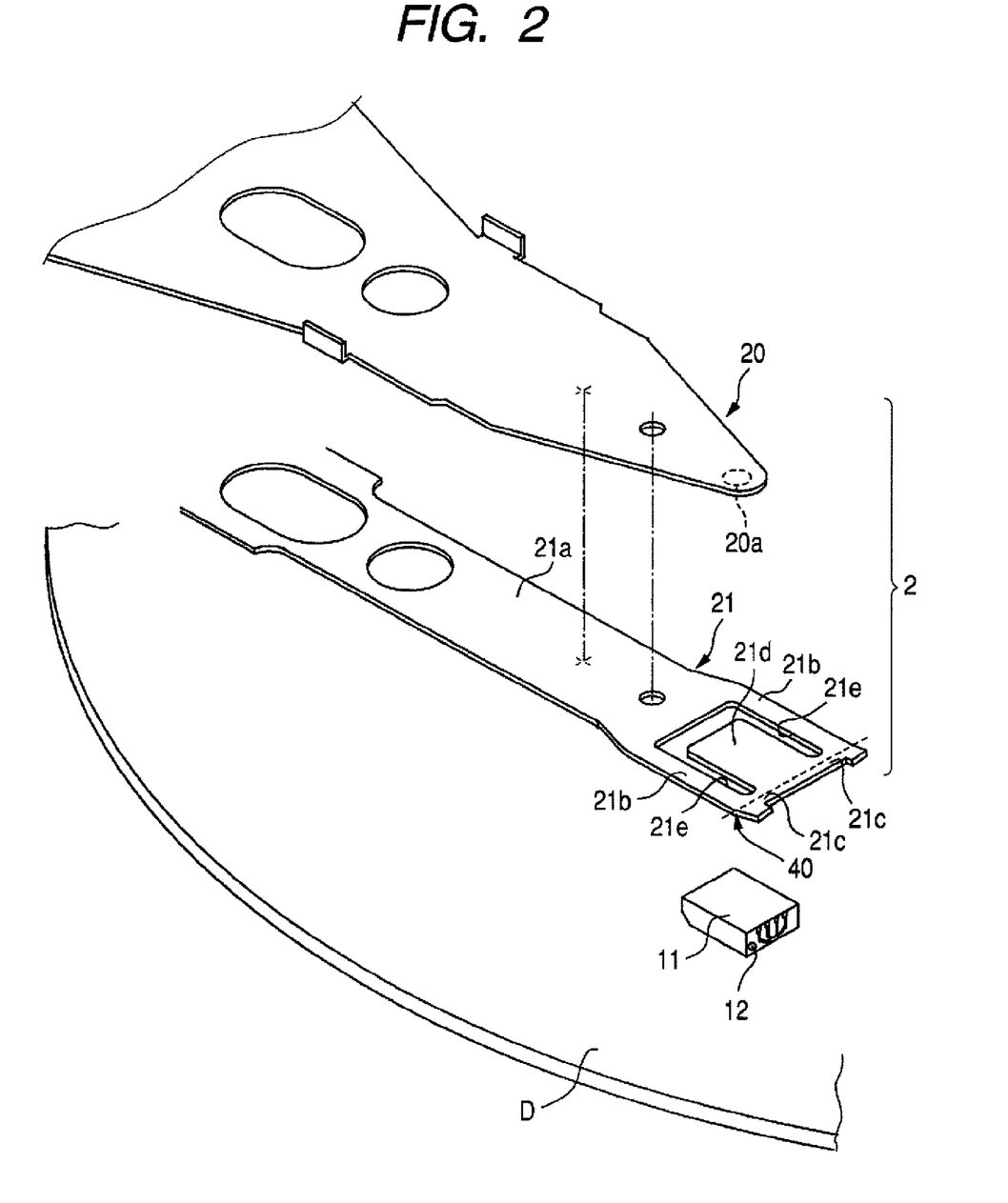
FIG. 2 is an exploded perspective view that shows each member when the magnetic head assembly of FIG. 1 is disassembled.

FIG. 2 is an exploded perspective view that shows each member when the magnetic head assembly 1 of FIG. 1 is disassembled. The load beam 20 and the flexure 21 are formed of leaf springs (metallic material, in general, stainless). The load beam 20 has a free end (leading end), which is formed in such a flat shape that narrows as it goes to the end, and a hemispherical contact (hemispherical protrusion) 20a, which protrudes toward the disk D (downward in the drawing), is formed at the free end.

The flexure 21 includes a base 21a. A pair of outriggers 21b extend forward (in a free end direction of the load beam 20) from the base 21a. A connection portion 21c connects leading ends of the outriggers 21b. A tongue portion 21d is connected to the connection portion 21c between the outriggers 21b. A U-shaped slit 21e is formed so as to be surrounded by the tongue portion 21d, the pair of outriggers 21b, and the connection portion 21c.

The tongue portion 21d is elastically deformable with the connection portion 21c used as a fulcrum with respect to the pair of outriggers 21b. The top surface of the tongue portion 21d abuts on the hemispherical contact 20a of the load beam 20, and the slider 11, which is fixedly bonded to the bottom surface of the tongue portion 21d, is movable with the vertex of the hemispherical contact 20a used as a fulcrum. The load beam 20 has elastic force in a direction that connects the slider 11 to the disk D.

Figure 3:
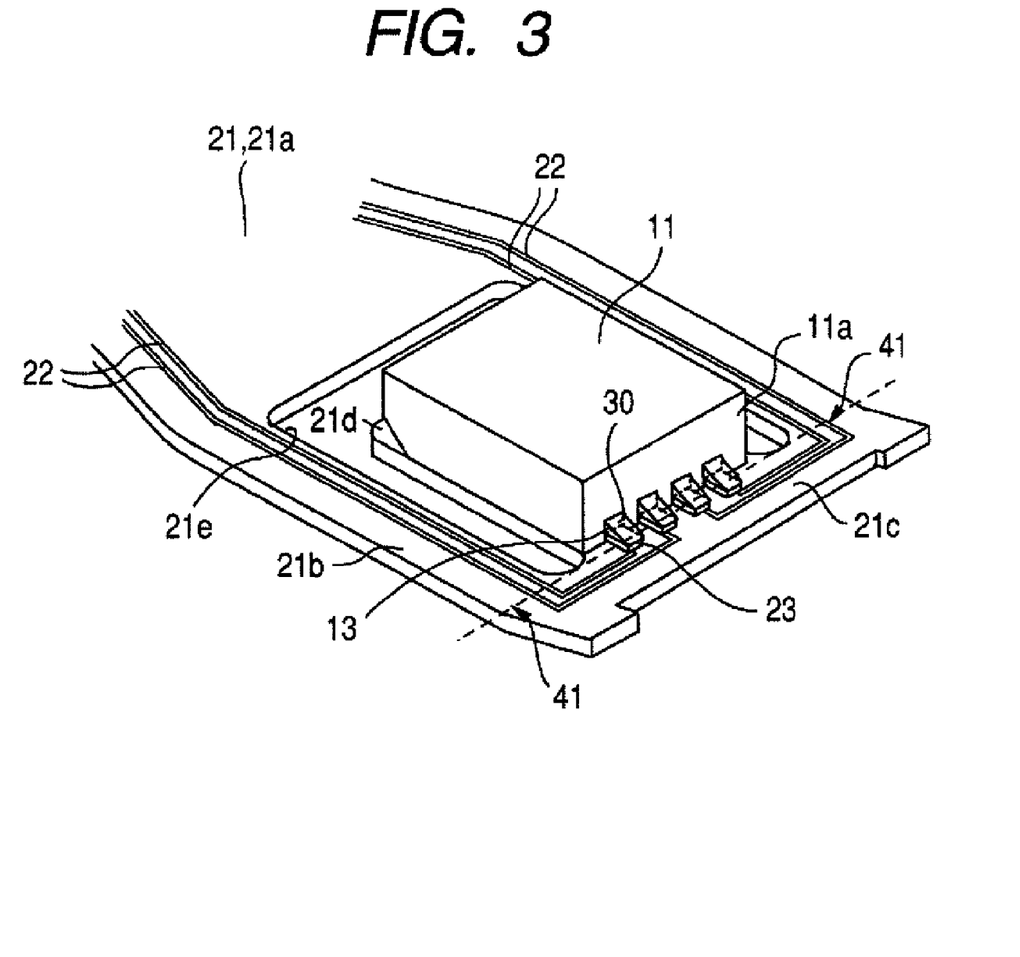
FIG. 3 is a perspective view that shows an easily deformable portion formed on an extended line on which solder bonded portions are arranged.

As shown in FIGS. 1 and 3, a flexible wiring substrate 22 electrically connecting a circuit system of a hard disk device in which the magnetic head assembly 1 is mounted and the head element 12 is fixedly bonded to the bottom surface of the flexure 21. The flexible wiring substrate 22 includes a plurality of electrode pads 23 (FIG. 3) disposed on the connection portion of the flexure 21.

The flexible wiring substrate 22 extends along the pair of outriggers 21b from the plurality of electrode pads 23 on the outriggers 21b and is drawn out from the base 21a of the flexure 21. In one embodiment, the flexible wiring substrate 22 is also connected to an intermediate flexible wiring substrate 24. The intermediate flexible wiring substrate 24 is connected to the circuit system of the hard disk device in which the magnetic head assembly 1 is mounted. A plurality of electrode pads 13 connected to the head element 12 is disposed on an end surface 11a of the slider 11, and the plurality of electrode pads 13 and a plurality of electrode pads of the flexible wiring substrate 22 are bonded to each other in an orthogonal relationship by solder. The plurality of solder bonded portions 30 are formed so as to be linearly arranged on the connection portion 21c of the flexure 21.

In one embodiment of the magnetic head assembly 1, an easily deformable portion 41 is formed in the pair of outriggers 21b of the flexure 21 so as to be located on an extended line, on which the plurality of solder bonded portions 30 are arranged, to make it easy to deform the free end side of the flexure 21.

Figure 4:
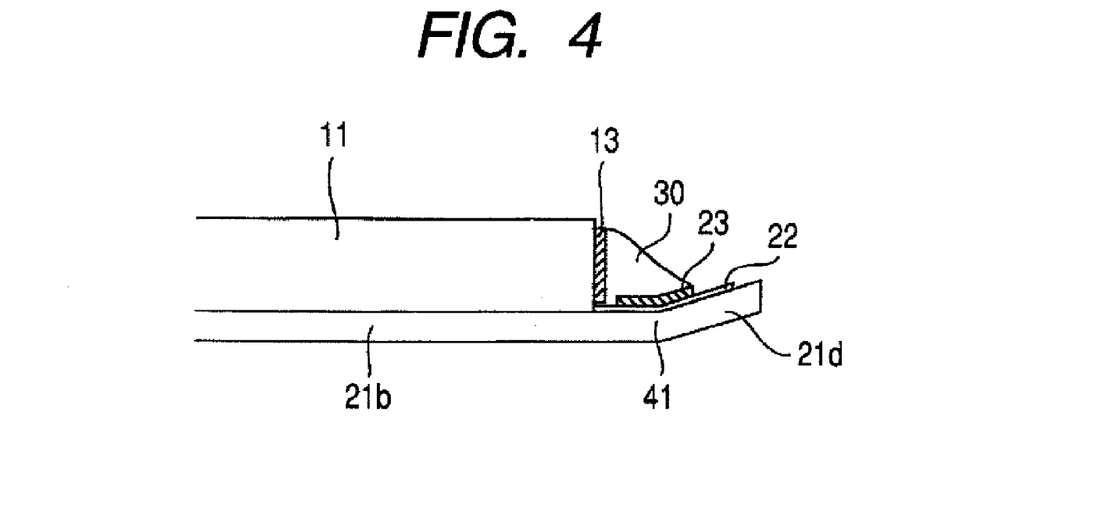
FIG. 4 is a cross-sectional view that shows the easily deformable portion of FIG. 3.

FIG. 3 is a perspective view of the easily deformable portion 41, and FIG. 4 is a cross-sectional view of the easily deformable portion 41.

The easily deformable portion 41 according to one embodiment is composed of a bent portion that is formed by bending a free end portion of the flexure 21 toward the base 21a (in the counterclockwise direction in FIGS. 3 and 4). As for the flexure 21, if stress is applied in a direction that erects the free end portion toward the base 21a, portions (free ends of the pair of outriggers 21b, and the connection portion 21c) that are closer to the free end than the easily deformable portion 41 are exclusively bent, and portions (portions other than the leading ends of the outriggers 21b, and the base 21a) that are closer to the base 21a than the easily deformable portion 41 are hardly bent. A bent angle of the easily deformable portion 41 is preferably set to about 1 degree.

Figure 5:
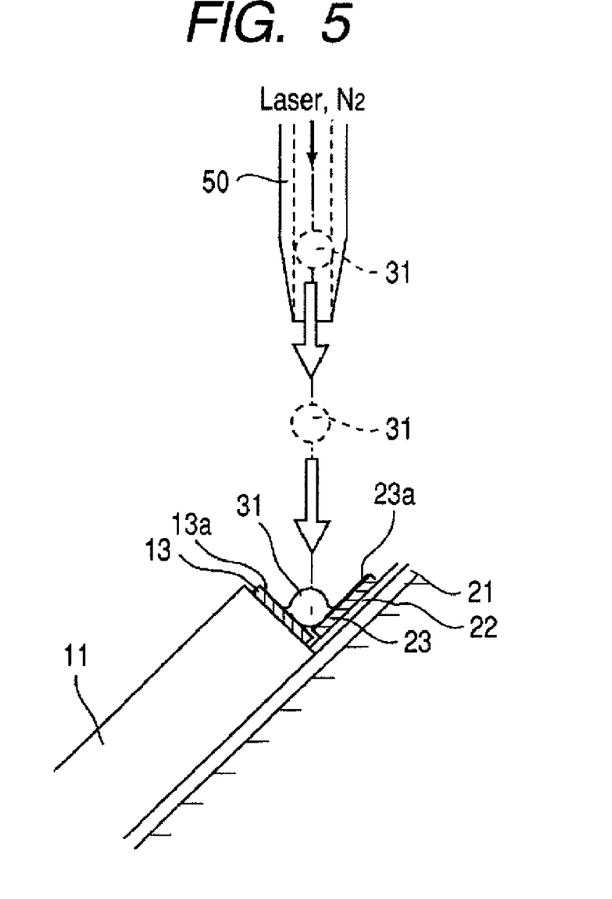
FIG. 5 is a schematic view that illustrates a solder ball bonding method using a capillary.

However, as shown in FIG. 5, as a solder ball 31, which is melted by irradiation of laser, is naturally dropped on the bonded surfaces of the two electrode pads 13 and 23 of the slider 11 and the flexible wiring substrate 22 by using a capillary 50 and then solidified on the bonded surfaces, the plurality of solder bonded portions 30 is formed.

Figure 6:
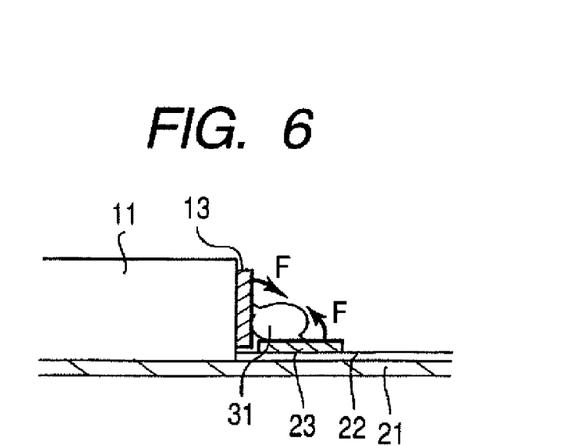
FIG. 6 is a conceptual view that illustrates shrinkage stress to be generated by solidification of solder.

In the solder bonding, when the solder ball 31 is solidified, as shown in FIG. 6, shrinkage stress F is generated due to the compression of the solder ball, so that the electrode pad 13 of the slider 11 is pulled toward the electrode pad 23 of the flexible wiring substrate 22, and the electrode pad 23 of the flexible wiring substrate 22 is pulled toward the electrode pad 13 of the slider 11. Particularly, when the melted solder ball 31 is applied onto the bonded surface, the solder ball 31 is rapidly cooled, and thus a large shrinkage stress F is generated. Due to the shrinkage stress F, the easily deformable portion 41 of the flexure 21 is deformed.

In one embodiment, the easily deformable portion 41 is composed of the bent portion that is formed by bending the free end of the flexure 21 toward the base 21a (in the counterclockwise direction in FIGS. 3 and 4); therefore, if the shrinkage stress F is applied, portions (free ends of the outriggers 21b and the connection portion 21c) that are closer to the free end than the easily deformable portion 41 are significantly bent.

In one embodiment, when the easily deformable portions 41 are deformed as described above, the easily deformable portion 41 absorbs most of the shrinkage stress F caused by the solidification of solder. Accordingly, a small shrinkage stress is applied to the electrode pad 13 of the slider 11, for example, portions (portions other than the leading ends of the outriggers 21b, and the base 21a) closer to the base 21a of the flexure 21 than the easily deformable portion 41. Therefore, since the portions closer to the base 21a of the flexure 21 are unremarkably deformed, the position of the slider is sufficiently prevented from changing. Although the free end side of the flexure 21 is bent, the position of the slider 11 and head characteristics are free from disadvantageous effects.

Figure 7A:
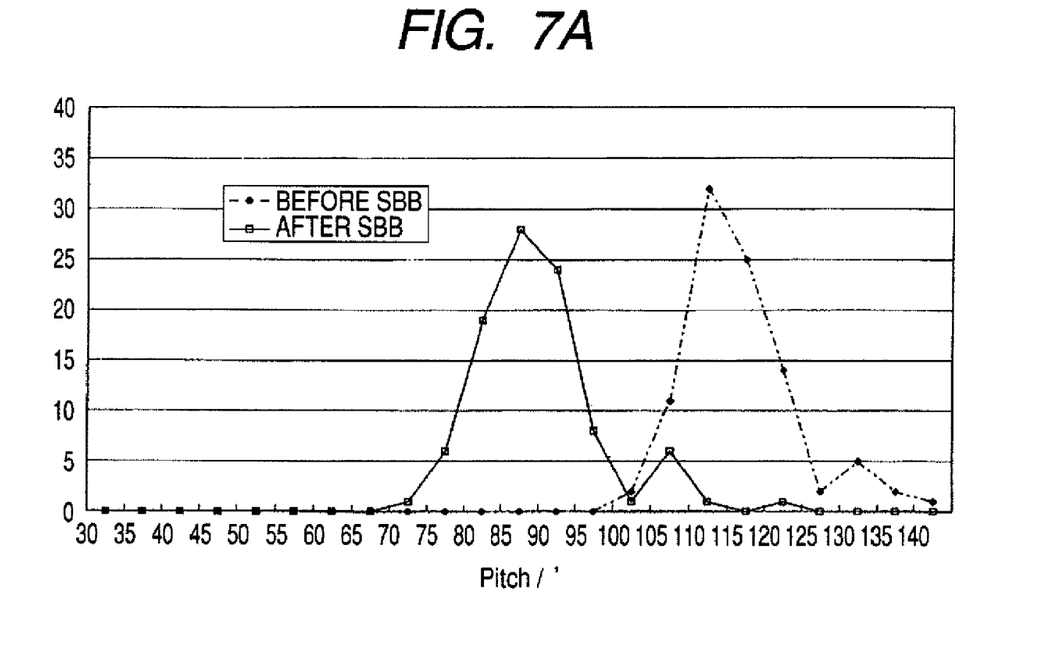
FIGS. 7A and 7B are line graphs that illustrate distribution of positional changes (pitch angle changes) of a slider before and after soldering in the present embodiment including the easily deformable portion composed of a bent portion and a comparative example not including the easily deformable portion, respectively.
Figure 7B:
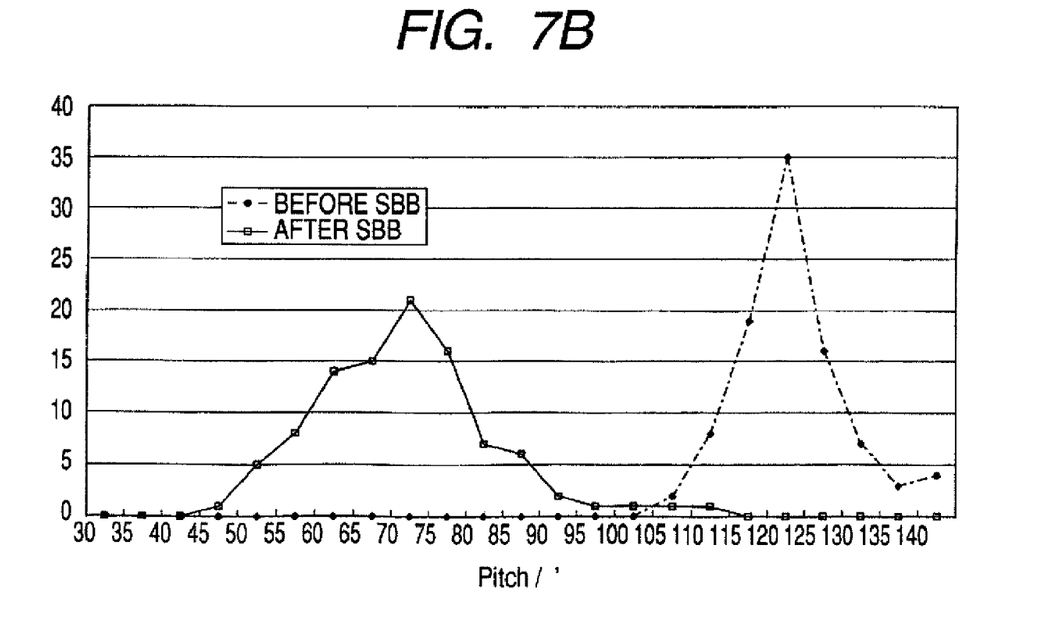

FIG. 7 is a line graph that shows the distribution of positional changes (pitch angle changes) of the slider 11 before and after soldering. FIG. 7A shows a present embodiment that includes the easily deformable portion 41 composed of the bent portion. FIG. 7B shows a comparative example not including an easily deformable portion. The present embodiment and the comparative example have the same structure except the presence of the easily deformable portion 41, and provide a magnetic head assembly that is formed by the same process of manufacture. Multiple samples that are formed at once by the same process of manufacture are subjected to the measurement for positional changes of the slider. In the present embodiment and the comparative example, soldering conditions are as follows:

Device; PacTech's SBB (Solder Ball Bumper),
Laser irradiation; 40A for 2 ms, and
Solder ball diameter; 100 μm.

EMBODIMENT

As shown in FIG. 7A, while the peak is found in the range of pitch angle 110 to 115' before soldering, the peak is found in the range of pitch angle 85 to 90' after soldering, and thus the positional difference of peak is about 25' before and after soldering.

Specific measurement of the positional changes (pitch angle (')) of slider before and after soldering is shown in Table 1.

TABLE 1

|  | Before soldering | After soldering | Amount of Change |
|---|---|---|---|
| Maximum value | 143.25' | 116.27' | −25.9' |
| Average value | 112.265' | 84.698' | −27.567' |
| Minimum value | 96.82' | 67.8' | −29.97' |
| Max − Min | 46.43' | 48.47' | 4.88' |

COMPARATIVE EXAMPLE

As shown in FIG. 7B, while the peak is found at a pitch angle of about 120' before soldering, the peak is found in the range of pitch angle 70 to 75' after soldering, and thus the positional difference of peak is about 50' before and after soldering. In addition, inclination of peak of pitch angle becomes more gradual after soldering than before soldering.

Measurement of the positional changes (pitch angle (')) of slider before and after soldering is shown in Table 2.

TABLE 2

|  | Before soldering | After soldering | Amount of Change |
|---|---|---|---|
| Maximum value | 147.95' | 107.29' | −40.45' |
| Average value | 119.828' | 66.982' | −52.847' |
| Minimum value | 102.91' | 41.34' | −104.46' |
| Max − Min | 45.04' | 65.95' | 64.01' |

As clearly shown in FIGS. 7A and 7B and Tables 1 and 2, the amount of positional change of slider before and after soldering is significantly smaller in the embodiment (max-min amount of change 4.88') than in the comparative example (max-min amount of change 64.01'). Therefore, the embodiment including the easily deformable portion 41 is more beneficial in preventing positional change of the slider 11 than the comparative example not including the easily deformable portion.

Figure 8:
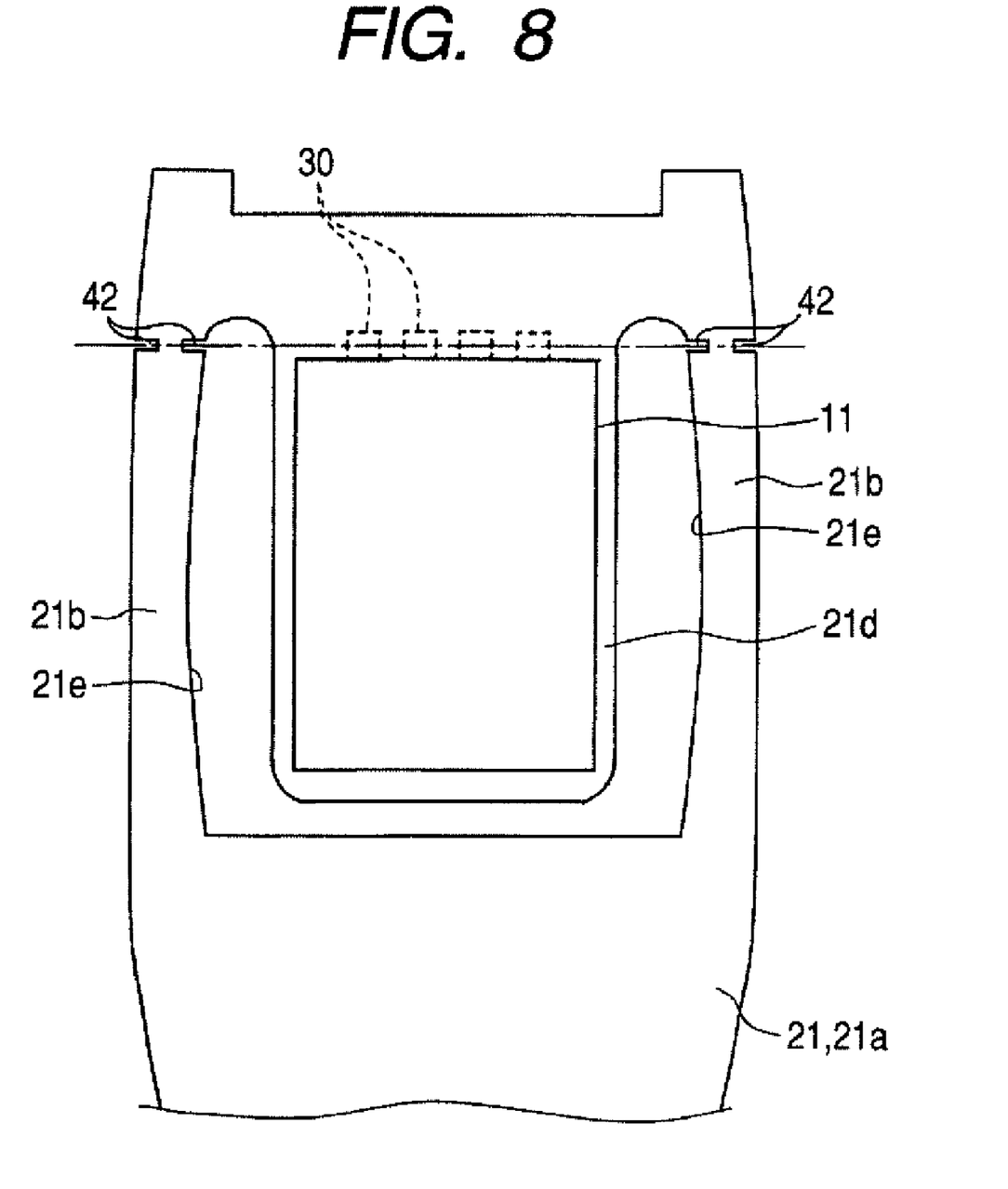
FIG. 8 is a plan view that shows an easily deformable portion according to another embodiment.
Figure 9:
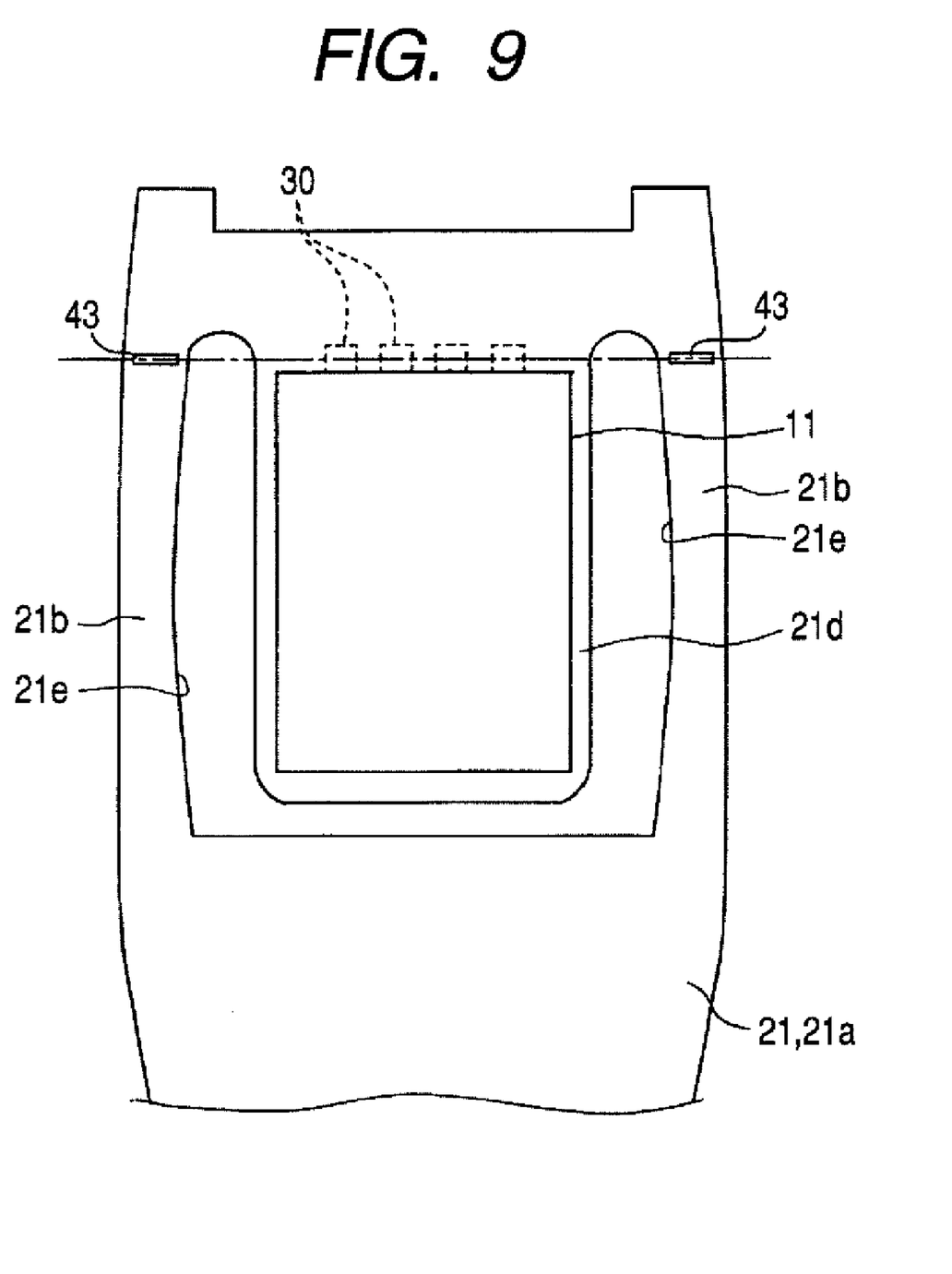
FIG. 9 is a plan view that shows an easily deformable portion according to still another embodiment.
Figure 10A:
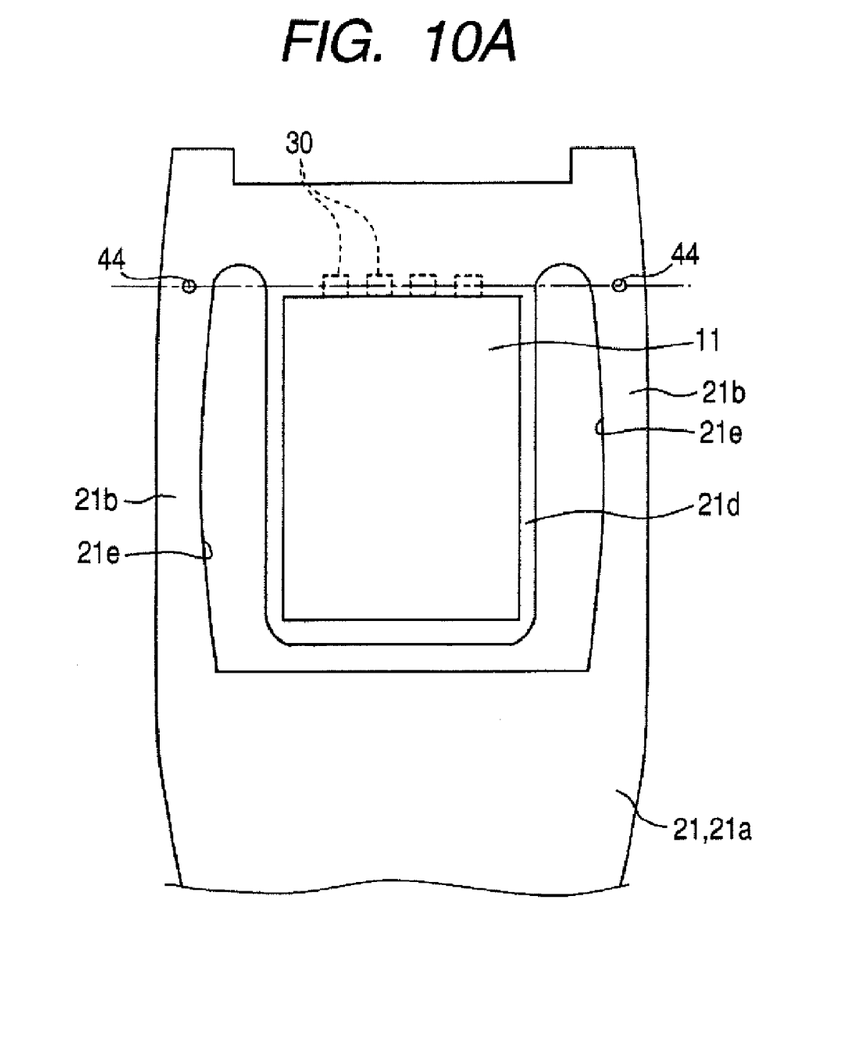
FIGS. 10A and 10B are a plan view and a cross-sectional view that show an easily deformable potion according to yet another embodiment, respectively.
Figure 10B:
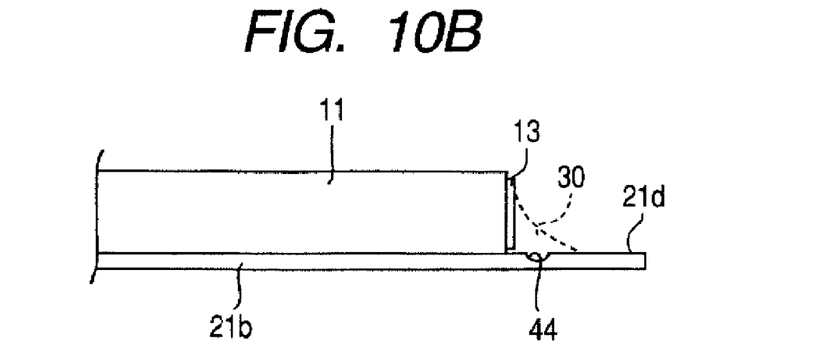

In the present embodiment, the magnetic head assembly 1 includes the easily deformable portion 41 formed of a bent portion, but the easily deformable portion 41 may be formed of a member other than the bent portion. For example, a modification in which the outriggers 21b are partially narrowed so as to be easily deformable by an easily deformable portion composed of a pair of notches 42 formed at both ends in a width direction of the pair of outriggers 21b may be provided (FIG. 8). In another embodiment, the outriggers 21b are decreased in size so as to be easily deformable by an easily deformable portion formed of one or more openings 43 that are formed in parallel to the arrangement direction of the solder bonded portion 30 in the pair of outriggers 21b may be provided (FIG. 9). Alternatively, a modification in which the outriggers 21b are decreased in thickness so as to be easily deformable by an easily deformable portion formed of a groove 44 that is formed on the front or rear surface of the pair of outriggers 21b (FIG. 10) may be provided. For example, any modification is possible as long as the outriggers 21b can be made easily deformable by partially weakening the mechanical strength of the pair of outriggers 21b on an extended line on which the solder bonded portions 30 are arranged. Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A magnetic head assembly comprising:
a slider in which a head element is mounted;
a flexure, which supports the slider, includes a pair of outriggers, a connection portion, and a tongue portion; and
a flexible wiring substrate that is fixedly bonded to the surface of the flexure,
wherein an electrode pad of the slider and an electrode pad of the flexible wiring substrate are bonded to each other by solder,
wherein a plurality of solder bonded portions of the electrode pad are arranged on the connection portion,
wherein a deformable portion is formed in the pair of outriggers and located on an extended line on which the solder bonded portions are arranged, so that the free end side of the flexure is deformable, and
wherein the deformable portion is composed of a notch which partially narrows the pair of outriggers.

2. A magnetic head assembly comprising:
a slider in which a head element is mounted;
a flexure, which supports the slider, includes a pair of outriggers, a connection portion, and a tongue portion; and
a flexible wiring substrate that is fixedly bonded to the surface of the flexure,
wherein an electrode pad of the slider and an electrode pad of the flexible wiring substrate are bonded to each other by solder,
wherein a plurality of solder bonded portions of the electrode pad are arranged on the connection portion,
wherein a deformable portion is formed in the pair of outriggers and located on an extended line on which the solder bonded portions are arranged, so that the free end side of the flexure is deformable, and
wherein the deformable portion is composed of one or more openings which decrease the area of the pair of outriggers.

3. The magnetic head assembly according to claim 2, wherein the one or more openings are formed in parallel to the arrangement direction of the solder bonded portions.

4. A magnetic head assembly comprising:
a slider in which a head element is mounted;
a flexure, which supports the slider, includes a pair of outriggers, a connection portion, and a tongue portion; and a flexible wiring substrate that is fixedly bonded to the surface of the flexure, wherein an electrode pad of the slider and an electrode pad of the flexible wiring substrate are bonded to each other by solder, wherein a plurality of solder bonded portions of the electrode pad are arranged on the connection portion, wherein a deformable portion is formed in the pair of outriggers and located on an extended line on which the solder bonded portions are arranged, so that the free end side of the flexure is deformable, and wherein the easily deformable portion is composed of a groove which is formed on a front or rear surface of the pair of outriggers.

* * * * *